United States Patent
Ikeno et al.

(10) Patent No.: US 9,631,062 B2
(45) Date of Patent: Apr. 25, 2017

(54) SILICONE GEL COMPOSITION AND SILICONE GEL CURED PRODUCT

(71) Applicant: SHIN-ETSU CHEMICAL CO., LTD., Tokyo (JP)

(72) Inventors: Masayuki Ikeno, Maebashi (JP); Kazuyasu Sato, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/025,479

(22) PCT Filed: Jul. 29, 2014

(86) PCT No.: PCT/JP2014/003968
§ 371 (c)(1),
(2) Date: Mar. 28, 2016

(87) PCT Pub. No.: WO2015/056374
PCT Pub. Date: Apr. 23, 2015

(65) Prior Publication Data
US 2016/0229983 A1    Aug. 11, 2016

(30) Foreign Application Priority Data
Oct. 17, 2013  (JP) .................................. 2013-215989

(51) Int. Cl.
| C08L 83/04 | (2006.01) |
| C08K 3/04 | (2006.01) |
| H01L 23/29 | (2006.01) |
| C08G 77/12 | (2006.01) |
| C08G 77/20 | (2006.01) |
| C08K 5/56 | (2006.01) |

(52) U.S. Cl.
CPC .............. *C08K 3/04* (2013.01); *C08L 83/04* (2013.01); *H01L 23/296* (2013.01); *C08G 77/12* (2013.01); *C08G 77/20* (2013.01); *C08K 5/56* (2013.01); *C08K 2201/011* (2013.01); *H01L 2924/0002* (2013.01)

(58) Field of Classification Search
None
See application file for complete search history.

(56) References Cited

U.S. PATENT DOCUMENTS

| 5,432,280 | A | * | 7/1995 | Hara ........................ C08L 83/04 |
| | | | | 524/265 |
| 2003/0047718 | A1 | * | 3/2003 | Narayan .................. C08K 9/02 |
| | | | | 252/500 |
| 2003/0180484 | A1 | * | 9/2003 | Imai ..................... C10M 111/04 |
| | | | | 428/34.1 |
| 2003/0213939 | A1 | * | 11/2003 | Narayan ................. B82Y 10/00 |
| | | | | 252/500 |
| 2004/0147702 | A1 | | 7/2004 | Terada et al. |
| 2008/0293877 | A1 | * | 11/2008 | Alexandre ............... C08K 7/24 |
| | | | | 524/588 |
| 2010/0189903 | A1 | | 7/2010 | Aoyama |
| 2010/0298180 | A1 | * | 11/2010 | Patel ...................... B82Y 30/00 |
| | | | | 508/113 |
| 2010/0308279 | A1 | * | 12/2010 | Zhou ...................... B82Y 30/00 |
| | | | | 252/511 |

FOREIGN PATENT DOCUMENTS

| JP | H02-269771 A | 11/1990 |
| JP | 2002-322364 A | 11/2002 |
| JP | 2005-206761 A | 8/2005 |
| JP | 2007-126576 A | 5/2007 |
| JP | 2008-291148 A | 12/2008 |
| JP | 2010-037537 A | 2/2010 |
| JP | 2010-174084 A | 8/2010 |
| JP | 2012-251116 A | 12/2012 |

OTHER PUBLICATIONS

Vast et al. "Multiwalled carbon nanotubes functionalized with 7-octenyltrichlorosilane and n-octyltrichlorosilane: dispersion in Sylgard 184 silicone and Young's modulus" J. Mater. Sci. 2009, 44, 3476-3482.*
A Guide to Shore Durometers, taken from the internet on Jul. 2016, date unknown, 5 pages.*
Sylgard 184 technical data sheet, 1 page, 2016.*
Jul. 5, 2016 Office Action issued in Japanese Patent Application No. 2015-542487.
Aug. 26, 2014 Search Report issued in International Patent Application No. PCT/JP2014/003968.
Apr. 19, 2016 International Preliminary Report on Patentability issued in PCT International Patent Application No. PCT/JP2014/003968.

* cited by examiner

*Primary Examiner* — Robert S Loewe
(74) *Attorney, Agent, or Firm* — Oliff PLC

(57) ABSTRACT

A silicone gel composition including: an organopolysiloxane shown by the following general formula: $R_a R^1_b SiO_{(4-a-b)/2}$, having one or more alkenyl groups bound to a silicon atom in one molecule, wherein the amount is 100 parts by mass; an organohydrogenpolysiloxane shown by the following general formula: $R^2_c H_d SiO_{(4-c-d)/2}$, having two or more hydrogen atoms bound to a silicon atom in one molecule, wherein the amount is such that 0.6 to 3 hydrogen atoms bound to a silicon atom is contained relative to one alkenyl group bound to a silicon atom in the component; a platinum-based catalyst, wherein the amount is an effective amount; and a carbon nanotube, wherein the amount is 0.01 to 3 parts by mass. This provides a silicone gel composition which can be a silicone gel cured product with low elastic modulus, low stress, and excellent heat resistance at 230° C., when it is cured.

1 Claim, No Drawings

US 9,631,062 B2

SILICONE GEL COMPOSITION AND SILICONE GEL CURED PRODUCT

TECHNICAL FIELD

The present invention relates to a silicone gel composition and a silicone gel cured product obtained by curing the composition.

BACKGROUND ART

A silicone gel composition is an addition curing organopolysiloxane composition which contains an organohydrogenpolysiloxane having a hydrogen atom bound to a silicon atom (i.e., an SiH group), an organopolysiloxane having an alkenyl group such as a vinyl group bound to a silicon atom, and a platinum-based catalyst to give a cured product by an addition reaction of the hydrogen atom bound to a silicon atom to the alkenyl group. The silicone gel cured product cured by heating this silicone gel composition has excellent heat resistance, weather resistance, oil resistance, cold resistance, electrical insulating properties, and so on; has low elastic modulus and low stress; thereby being used for protecting electronic components such as an onboard electronic component and an electronic component for consumer use. Particularly, low elastic modulus and low stress, which are features of a silicone gel cured product, are exclusive features that are not realized by other elastomer products. Recently, heat resistance is increasingly required for a silicone gel cured product used for sealing due to a requirement for high reliability of an onboard electronic component and an electronic component for consumer use.

As a means to improve the heat resistance of a silicone gel cured product, it is disclosed that hydroxyl groups in a composition is reduced to 150 ppm or less (see patent document 1). It is also disclosed that an alkoxysilane compound and an organic titanate ester are contained in a composition with a particular organopolysiloxane (see patent document 2). Furthermore, it is disclosed that a reaction product obtained by a heat treatment of a particular metal carboxylate salt and an organopolysiloxane at a high temperature is contained in a composition (see patent document 3), and so on.

CITATION LIST

Patent Literature

Patent Document 1: Japanese Unexamined Patent publication (Kokai) No. H2-269771
Patent Document 2: Japanese Unexamined Patent publication (Kokai) No. 2002-322364
Patent Document 3: Japanese Unexamined Patent publication (Kokai) No. 2008-291148

SUMMARY OF INVENTION

Technical Problem

In any of these patent documents, however, the obtained heat resistance is up to 200° C., and the heat resistance at 230° C. has not been obtained. Accordingly, it has been desired to develop a silicone gel composition which can be a silicone gel cured product with excellent heat resistance at 230° C., when it is cured.

The present invention was accomplished to solve the foregoing problems. It is an object of the present invention to provide a silicone gel composition which can be a silicone gel cured product with low elastic modulus and low stress as well as excellent heat resistance at 230° C., when it is cured.

Solution to Problem

To solve the foregoing problems, the present invention provides a silicone gel composition comprising:
(A) an organopolysiloxane shown by the following general formula (1), having one or more alkenyl groups bound to a silicon atom in one molecule, wherein the amount is 100 parts by mass,

$$R_a R^1_b SiO_{(4-a-b)/2} \quad (1)$$

wherein "R" independently represents an alkenyl group, "R¹" independently represents a substituted or unsubstituted monovalent hydrocarbon group which does not contain an aliphatic unsaturated bond, "a" is a positive number of 0.0001 to 0.2, "b" is a positive number of 1.7 to 2.2, and a+b is 1.9 to 2.4;
(B) an organohydrogenpolysiloxane shown by the following general formula (2), having two or more hydrogen atoms bound to a silicon atom in one molecule, wherein the amount is such that 0.6 to 3 hydrogen atoms bound to a silicon atom is contained relative to one alkenyl group bound to a silicon atom in the component (A),

$$R^2_c H_d SiO_{(4-c-d)/2} \quad (2)$$

wherein R² independently represents a substituted or unsubstituted monovalent hydrocarbon group which does not contain an aliphatic unsaturated bond, "c" is a positive number of 0.7 to 2.2, "d" is a positive number of 0.001 to 1, and c+d is 0.8 to 3;
(C) a platinum-based catalyst, wherein the amount is an effective amount; and
(D) a carbon nanotube, wherein the amount is 0.01 to 3 parts by mass.

Such a silicone gel composition can be a silicone gel cured product with low elastic modulus and low stress as well as excellent heat resistance at 230° C., when it is cured.

In this case, it is preferable that the penetration number (measure of a softness) defined by JIS K 2220 (¼ cone), when the silicone gel composition is cured, is 10 to 200.

Such a silicone gel composition can be a silicone gel cured product with low elastic modulus and low stress more surely, when it is cured.

Furthermore, the present invention provides a silicone gel cured product obtained by curing the foregoing silicone gel composition, wherein the change of the penetration number of the silicone gel cured product after heating at 230° C. for 1,000 hours relative to the penetration number of the silicone gel cured product before the heating is −70% or higher. Herein, "change is −70% or higher" in the present invention means that the change of the penetration number does not go beyond −70% toward the negative side (i.e., an increase of a hardness of the silicone gel after a heating is suppressed).

Such a silicone gel cured product can maintain low elastic modulus and low stress even when it was subjected to a high temperature of 230° C. for a long time after curing.

Advantageous Effects of Invention

As mentioned above, the inventive silicone gel composition can be a silicone gel cured product with low elastic modulus and low stress, and having excellent heat resistance at 230° C. by containing a carbon nanotube, which gives superior heat resistance to the cured product, when it is cured. Furthermore, it is possible to maintain the silicone gel cured product with low elastic modulus and low stress even when it is subjected to a high temperature of 230° C. for a long time after curing.

Accordingly, such a silicone gel composition of the present invention can be suitably used for protecting electronic components such as an onboard electronic component and an electronic component for consumer use.

DESCRIPTION OF EMBODIMENTS

As mentioned above, it is desired to develop a silicone gel composition which can be a silicone gel cured product with excellent heat resistance at 230° C., when it is cured.

The present inventors diligently study to accomplish the above objects and consequently found that an addition curing organopolysiloxane composition can be a silicone gel cured product with low elastic modulus and low stress as well as excellent heat resistance at 230° C. by containing a carbon nanotube, when it is cured, thereby brought the present invention to completion.

That is, the present invention is a silicone gel composition comprising:

(A) an organopolysiloxane shown by the following general formula (1), having one or more alkenyl groups bound to a silicon atom in one molecule, wherein the amount is 100 parts by mass, $$R_a R^1{}_b SiO_{(4-a-b)/2} \quad (1)$$

wherein "R" independently represents an alkenyl group, "$R^1$" independently represents a substituted or unsubstituted monovalent hydrocarbon group which does not contain an aliphatic unsaturated bond, "a" is a positive number of 0.0001 to 0.2, "b" is a positive number of 1.7 to 2.2, and a+b is 1.9 to 2.4;

(B) an organohydrogenpolysiloxane shown by the following general formula (2), having two or more hydrogen atoms bound to a silicon atom in one molecule, wherein the amount is such that 0.6 to 3 hydrogen atoms bound to a silicon atom is contained relative to one alkenyl group bound to a silicon atom in the component (A), $$R^2{}_c H_d SiO_{(4-c-d)/2} \quad (2)$$

wherein $R^2$ independently represents a substituted or unsubstituted monovalent hydrocarbon group which does not contain an aliphatic unsaturated bond, "c" is a positive number of 0.7 to 2.2, "d" is a positive number of 0.001 to 1, and c+d is 0.8 to 3;

(C) a platinum-based catalyst, wherein the amount is an effective amount; and (D) a carbon nanotube, wherein the amount is 0.01 to 3 parts by mass.

The silicone gel composition of the present invention contains the foregoing components (A) to (D) as essential components. It is to be noted that in the present invention, the silicone gel cured product means a cured product with low crosslinking density in which an organopolysiloxane is a main component. Such a cured product, for example, has a penetration number defined by JIS K 2220 (¼ cone) of 10 to 200. Such a cured product exhibits a measured value of 0 in a measurement of a rubber hardness defined by JIS K 6301 (value of rubber hardness), and corresponds to a material which hardness is too low (i.e., soft) to indicate a significant value of rubber hardness. In this point, the silicone gel cured product is totally different from a so called silicone rubber cured product (rubber-like elastic material).

Hereinafter, the present invention will be described in detail, but the present invention is not limited thereto.

It is to be noted that in this specification, the viscosity is a value at 25° C.

[(A) Organopolysiloxane]

The component (A) of the inventive silicone gel composition is a main reagent (base polymer) of the silicone gel composition. This component (A) is an organopolysiloxane shown by the following general formula (i.e., an average composition formula) (1), having one or more alkenyl groups bound to a silicon atom in one molecule (referred to a "silicon atom-bonded alkenyl group" in this specification).

$$R_a R^1{}_b SiO_{(4-a-b)/2} \quad (1)$$

wherein "R" independently represents an alkenyl group, "$R^1$" independently represents a substituted or unsubstituted monovalent hydrocarbon group which does not contain an aliphatic unsaturated bond, "a" is a positive number of 0.0001 to 0.2, "b" is a positive number of 1.7 to 2.2, and a+b is 1.9 to 2.4.

In the general formula (1), "R" independently represents an alkenyl group, and has generally 2 to 6, preferably 2 to 4, more preferably 2 to 3 carbon atoms. Illustrative examples thereof include a vinyl group, an allyl group, a propenyl group, an isopropenyl group, a butenyl group, and an isobutenyl group; and a vinyl group is preferred.

In the general formula (1), "$R^1$" independently represents a substituted or unsubstituted monovalent hydrocarbon group which does not contain an aliphatic unsaturated bond, and has generally 1 to 10, preferably 1 to 6 carbon atoms. Illustrative examples thereof include alkyl groups such as a methyl group, an ethyl group, a propyl group, an isopropyl group, a butyl group, an isobutyl group, a tert-butyl group, a pentyl group, a hexyl group, a cyclohexyl group, an octyl group, and a decyl group; aryl groups such as a phenyl group and a tolyl group; aralkyl groups such as a benzyl group and a phenylethyl group; and groups in which hydrogen atoms of these groups are partially or fully substituted by a halogen atom(s) such as chlorine, bromine, and fluorine, for example, a chloromethyl group and a 3,3,3-trifluoropropyl group. Among them, a methyl group, a phenyl group, and a 3,3,3-trifluoropropyl group are preferable in view of easy synthesis and chemical stability at a high temperature.

In the general formula (1), "a" is a positive number of 0.0001 to 0.2, preferably a positive number of 0.0005 to 0.1, more preferably 0.001 to 0.05; "b" is a positive number of 1.7 to 2.2, preferably a positive number of 1.9 to 2.02. In addition, a+b essentially meet the range of 1.9 to 2.4, and preferably meet the range of 1.95 to 2.05.

The component (A) needs to have one or more silicon atom-bonded alkenyl groups in one molecule on the average, and preferably has two or more, more preferably 2 to 50, further preferably 2 to 10 of the foregoing alkenyl groups. The values of the foregoing "a" and "b" may be selected so as to meet this requirement of the silicon atom-bonded alkenyl group.

The number of silicon atoms in an organopolysiloxane molecule of the component (A) (i.e., polymerization degree) is generally 10 to 2,000, and in view of obtaining good handling and workability of the composition, and properties of the cured product (low elastic modulus, low stress), it is preferably 20 to 1,000, more preferably 50 to 500. It is to be noted that the polymerization degree (or molecular weight) can be obtained as, for example, a number-average degree of polymerization (or a number-average molecular weight) in terms of polystyrene by a gel permeation chromatography (GPO) analysis using a developing solvent such as toluene.

The molecular structure of the organopolysiloxane of the component (A) is not particularly limited, and may be linear structure or may be branched structure containing a $RSiO_{3/2}$ unit, a $R^1SiO_{3/2}$ unit, and a $SiO_2$ unit, for example. Preferable example is an organopolysiloxane shown in the following general formula (1a), that is, a linear diorganopolysiloxane in which the main chain is basically consisting of repeating diorganosiloxane units and both terminals of which are blocked with triorganosiloxy groups.

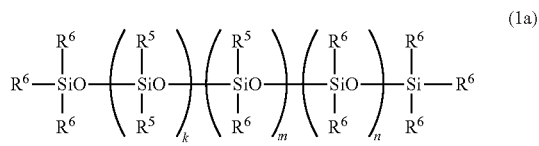

(1a)

wherein, each "$R^5$" independently represents a substituted or unsubstituted monovalent hydrocarbon group which does not contain an aliphatic unsaturated bond, each "$R^6$" independently represents an alkenyl group or a substituted or unsubstituted monovalent hydrocarbon group which does not contain an aliphatic unsaturated bond, with the proviso that one or more "$R^6$" are alkenyl groups; when either of the "$R^6$" at the both terminals of the molecular chain is an alkenyl group, "k" is an integer of 40 to 1,200, "m" is an integer of 0 to 50, and "n" is an integer of 0 to 50; and when neither of the "$R^6$" at the both terminals of the molecular chain is an alkenyl group, "k" is an integer of 40 to 1,200, "m" is an integer of 1 to 50, preferably an integer of 2 to 50, and "n" is an integer of 0 to 50.

In the general formula (1a), the substituted or unsubstituted monovalent hydrocarbon group which does not contain an aliphatic unsaturated bond except for an alkenyl group shown by "$R^5$" generally has 1 to 10, preferably 1 to 6 carbon atoms. Illustrative examples thereof include the ones exemplified in "$R^1$" in the foregoing general formula (1). Among them, a methyl group, a phenyl group, and a 3,3,3-trifluoropropyl group are preferable in view of easiness of synthesis and chemical stability at high temperature.

In the general formula (1a), each independent substituted or unsubstituted monovalent hydrocarbon group which does not contain an aliphatic unsaturated bond shown by "$R^6$" generally has 1 to 10, preferably 1 to 6 carbon atoms. Illustrative examples thereof include the ones exemplified in "$R^1$" in the foregoing general formula (1). Among them, a methyl group, a phenyl group, and a 3,3,3-trifluoropropyl group are preferable in view of easiness of synthesis and chemical stability at high temperature. The alkenyl group shown by "$R^6$" generally has 2 to 6, preferably 2 to 4, more preferably 2 to 3 carbon atoms. Illustrative examples thereof include a vinyl group, an allyl group, a propenyl group, an isopropenyl group, a butenyl group, and an isobutenyl group; and a vinyl group is particularly preferred.

In the general formula (1a), when any of "$R^6$" at the both terminals of the molecular chain is an alkenyl group, it is preferable that "k" is an integer of 100 to 1,000, "m" is an integer of 0 to 40, and "n" is 0; and when neither of the "$R^6$" at the both terminals of the molecular chain is an alkenyl group, it is preferable that "k" is an integer of 100 to 1,000, "m" is an integer of 2 to 40, and "n" is 0.

Illustrative examples of the organopolysiloxane shown by the general formula (1a) include dimethylpolysiloxane both terminals of which are blocked with dimethylvinylsiloxy groups, a dimethylsiloxane/methylvinylsiloxane copolymer both terminals of which are blocked with dimethylvinylsiloxy groups, a dimethyl-siloxane/diphenylsiloxane copolymer both terminals of which are blocked with dimethylvinylsiloxy groups, a dimethylsiloxane/methylphenylsiloxane copolymer both terminals of which are blocked with dimethylvinylsiloxy groups, a dimethylsiloxane/methylvinylsiloxane/diphenylsiloxane copolymer both terminals of which are blocked with dimethylvinylsiloxy groups, methyltrifluoropropylpolysiloxane both terminals of which are blocked with dimethylvinylsiloxy groups, a dimethylsiloxane/methyltrifluoropropylsiloxane copolymer both terminals of which are blocked with dimethylvinylsiloxy groups, a dimethylsiloxane/methyltrifluoropropylsiloxane/methylvinylsiloxane copolymer both terminals of which are blocked with dimethylvinylsiloxy groups, a dimethyl-siloxane/vinylmethylsiloxane copolymer both terminals of which are blocked with trimethylsiloxy groups, a dimethylsiloxane/vinylmethylsiloxane/diphenylsiloxane copolymer both terminals of which are blocked with trimethylsiloxy groups, a dimethylsiloxane/vinylmethyl-siloxane/methylphenylsiloxane copolymer both terminals of which are blocked with trimethylsiloxy groups, a vinylmethylsiloxane/methyltrifluoropropylsiloxane copolymer both terminals of which are blocked with trimethylsiloxy groups, a dimethylsiloxane/vinylmethyl-siloxane/methyltrifluoropropylsiloxane copolymer both terminals of which are blocked with trimethylsiloxy groups, dimethylpolysiloxane one terminal of which is blocked with a trimethylsiloxy group and another terminal of which is blocked with a dimethylvinylsiloxy group, a dimethylsiloxane/methylvinylsiloxane copolymer one terminal of which is blocked with a trimethylsiloxy group and another terminal of which is blocked with a dimethylvinylsiloxy group, a dimethylsiloxane/diphenylsiloxane copolymer one terminal of which is blocked with a trimethylsiloxy group and another terminal of which is blocked with a dimethylvinylsiloxy group, a dimethyl-siloxane/methylphenylsiloxane copolymer one terminal of which is blocked with a trimethylsiloxy group and another terminal of which is blocked with a dimethylvinylsiloxy group, a dimethylsiloxane/diphenylsiloxane/methylvinylsiloxane copolymer one terminal of which is blocked with a trimethylsiloxy group and another terminal of which is blocked with a dimethylvinylsiloxy group, methyltrifluoropropylpolysiloxane one terminal of which is blocked with a trimethylsiloxy group and another terminal of which is blocked with a dimethylvinylsiloxy group, a dimethylsiloxane/methyltrifluoropropylsiloxane copolymer one terminal of which is blocked with a trimethylsiloxy group and another terminal of which is blocked with a dimethylvinylsiloxy group, a dimethylsiloxane/methyltrifluoropropyl-siloxane/methylvinylsiloxane copolymer one terminal of which is blocked with a trimethylsiloxy group and another terminal of which is blocked with a dimethylvinylsiloxy group, dimethylpolysiloxane both terminals of which are blocked with methyldivinylsiloxy groups, a dimethylsiloxane/methylvinylsiloxane copolymer both terminals of which are blocked with methyldivinylsiloxy groups, a dimethylsiloxane/diphenylsiloxane copolymer both terminals of which are blocked with methyldivinylsiloxy groups, a dimethylsiloxane/methylphenylsiloxane copolymer both terminals of which are blocked with methyldivinylsiloxy groups, a dimethylsiloxane/methyl-vinylsiloxane/diphenylsiloxane copolymer both terminals of which are blocked with methyldivinylsiloxy groups, a dimethylsiloxane/methylvinylsiloxane/methylphenylsiloxane copolymer both terminals of which are blocked with methyldivinylsiloxy groups, methyltrifluoropropylpolysiloxane both terminals of which are blocked with methyldivinylsiloxy groups, a dimethylsiloxane/methyltrifluoropropylsiloxane copolymer both terminals of which are blocked with methyldivinylsiloxy groups, a dimethylsiloxane/methyltrifluoropropylsiloxane/methyl-vinylsiloxane copolymer both terminals of which are blocked with methyldivinylsiloxy groups, dimethylpolysiloxane both terminals of which are blocked with trivinylsiloxy groups, a dimethylsiloxane/methylvinylsiloxane copolymer both terminals of which are blocked with trivinylsiloxy groups, a dimethylsiloxane/diphenylsiloxane copolymer both terminals of which are blocked with trivinylsiloxy groups, a dimethylsiloxane/methylphenylsiloxane copolymer both terminals of which are blocked with trivinylsiloxy groups, a dimethyl-siloxane/methylvinylsiloxane/diphenylsiloxane copolymer both terminals of which are blocked with trivinylsiloxy groups, a dimethylsiloxane/methylvinylsiloxane/methylphenylsiloxane copolymer both terminals of which are blocked with trivinylsiloxy groups, methyltrifluoropropylpolysiloxane both terminals of which are blocked with trivinylsiloxy groups, a dimethyl-siloxane/methyltrifluoropropylsiloxane copolymer both terminals of which are blocked with trivinylsiloxy groups, and a dimethylsiloxane/methyltrifluoropropyl-siloxane/methylvinylsiloxane copolymer both terminals of which are blocked with trivinylsiloxy groups.

Although the viscosity of the organopolysiloxane of the component (A) is not particularly limited, the viscosity at 25° C. is preferably 50 to 100,000 mPa·s, more preferably 100 to 10,000 mPa·s in view of obtaining good handling and workability of the composition, strength of an obtained cured product, and flow property. In the present invention, viscosity can be measured by a rotational viscometer (such as a BL type, a BH type, a BS type, a cone and plate type, and a rheometer).

Incidentally, the organopolysiloxane of the component (A) can be a mixture of two or more kinds.

[(B) Organohydrogenpolysiloxane]

The component (B) of the inventive silicone gel composition reacts with the component (A), and thereby functions as a crosslinking agent (curing agent). The molecular structure of the organohydrogenpolysiloxane can be any of linear, cyclic, branched, and three-dimensional network-form (resin-form). This component (B) is an organohydrogenpolysiloxane shown by the following general formula (i.e., an average composition formula) (2), having two or more hydrogen atoms bound to a silicon atom (SiH group) in one molecule.

$$R^2_c H_d SiO_{(4-c-d)/2} \quad (2)$$

wherein $R^2$ independently represents a substituted or unsubstituted monovalent hydrocarbon group which does not contain an aliphatic unsaturated bond, "c" is a positive number of 0.7 to 2.2, "d" is a positive number of 0.001 to 1, and c+d is 0.8 to 3.

This organohydrogenpolysiloxane has two or more silicon atom-bonded hydrogen atoms (SiH group) in one molecule; preferably 3 to 500, more preferably 5 to 100, particularly preferably 10 to 80 SiH groups in one molecule. These silicon atom-bonded hydrogen atoms (Sib groups) may be bound whether to the silicon atom(s) at the terminal of a molecular chain or to the silicon atom(s) at the non-terminal of a molecular chain (in the middle of a molecular chain), and both of them may be contained in one molecule.

In the general formula (2), "$R^2$" independently represents a substituted or unsubstituted monovalent hydrocarbon group which does not contain an aliphatic unsaturated bond, and generally has 1 to 10, preferably 1 to 6 carbon atoms. Illustrative examples thereof include alkyl groups such as a methyl group, an ethyl group, a propyl group, an isopropyl group, a butyl group, an isobutyl group, a tert-butyl group, a pentyl group, a neopentyl group, a hexyl group, a cyclohexyl group, an octyl group, a nonyl group, and a decyl group; aryl groups such as a phenyl group, a tolyl group, a xylyl group, and a naphthyl group; aralkyl groups such as a benzyl group, a phenylethyl group, and a phenylpropyl group; and groups in which hydrogen atoms of these groups are partially or fully substituted by a halogen atom(s) such as chlorine, bromine, and fluorine, for example, a 3,3,3-trifluoropropyl group. Among them, alkyl groups, aryl groups, and a 3,3,3-trifluoropropyl group are preferable, and a methyl group, a phenyl group, and a 3,3,3-trifluoropropyl group are more preferable.

In the general formula (2), "c" is a positive number of 0.7 to 2.2, preferably a positive number of 1.0 to 2.1; "d" is a positive number of 0.001 to 1, preferably a positive number of 0.005 to 0.8, more preferably a positive number of 0.01 to 0.6; c+d is in the range of 0.8 to 3, preferably 1.0 to 2.7, more preferably 1.5 to 2.5.

The number of silicon atoms in one organohydrogenpolysiloxane molecule of the component (B) (i.e., polymerization degree) is generally 2 to 1,000, and in view of obtaining good handling and workability of the composition, and properties of the cured product (low elastic modulus, low stress), it is preferably 4 to 500, more preferably 10 to 200, further preferably 20 to 100.

Although the viscosity of the organohydrogenpolysiloxane of the component (B) is not particularly limited, the viscosity at 25° C. is preferably 0.1 to 5,000 mPa·s, particularly preferably 0.5 to 1,000 mPa·s, especially preferably 1 to 500 mPa·s for the same reasons described above.

Illustrative examples of the organohydrogenpolysiloxane shown by the general formula (2) include 1,1,3,3-tetramethyldisiloxane, 1,3,5,7-tetramethyl-tetracyclosiloxane, tris(dimethylhydrogensiloxy)-methylsilane, tris(dimethylhydrogensiloxy)phenylsilane, a cyclic polymer of methylhydrogensiloxane, a cyclic copolymer of methylhydrogensiloxane/dimethylsiloxane, methylhydrogenpolysiloxane both terminals of which are blocked with dimethylhydrogensiloxy groups, a methyl-hydrogensiloxane/dimethylsiloxane copolymer both terminals of which are blocked with dimethylhydrogensiloxy groups, a methylhydrogensiloxane/diphenylsiloxane copolymer both terminals of which are blocked with dimethylhydrogensiloxy groups, a methylhydrogen-siloxane/methylphenylsiloxane copolymer both terminals of which are blocked with dimethylhydrogensiloxy groups, a methylhydrogensiloxane/dimethylsiloxane/diphenylsiloxane copolymer both terminals of which are blocked with dimethylhydrogensiloxy groups, a methylhydrogen-siloxane/dimethylsiloxane/methylphenylsiloxane copolymer both terminals of which are blocked with dimethylhydrogensiloxy groups, methylhydrogenpolysiloxane both terminals of which are blocked with trimethylsiloxy groups, a dimethylsiloxane/methylhydrogensiloxane copolymer both terminals of which are blocked with trimethylsiloxy groups, a methylhydrogen-siloxane/diphenylsiloxane copolymer both terminals of which are blocked with trimethylsiloxy groups, a methylhydrogensiloxane/methylphenylsiloxane copolymer both terminals of which are blocked with trimethylsiloxy groups, a methylhydrogensiloxane/diphenylsiloxane/dimethylsiloxane copolymer both terminals of which are blocked with trimethylsiloxy groups, a methylhydrogensiloxane/dimethylsiloxane/methylphenylsiloxane copolymer both terminals of which are blocked with trimethylsiloxy groups; a copolymer composed of a $(CH_3)_2 HSiO_{1/2}$ unit, a $(CH_3)_3 SiO_{1/2}$ unit, and an $SiO_{4/2}$ unit; a copolymer composed of a $(CH_3)_2 HSiO_{1/2}$ unit and an $SiO_{4/2}$ unit; a copolymer composed of a $(CH_3)_2 HSiO_{1/2}$ unit, an $SiO_{4/2}$ unit, and a $(C_6H_5)_3 SiO_{1/2}$ unit; a copolymer composed of a $(CH_3)_2HSiO_{1/2}$ unit, a $(CH_3)_3SiO_{1/2}$ unit, and a $(CH_3)SiO_{3/2}$ unit; and a compound in which methyl groups of the foregoing compounds are partially or fully substituted by another alkyl group or a phenyl group.

The formulation amount of the component (B) is such that 0.6 to 3, preferably 0.7 to 2, more preferably 0.8 to 1.5 hydrogen atoms bound to a silicon atom is contained relative to one alkenyl group in the component (A). When the number of hydrogen atoms bound to a silicon atom in the component (B) is less than 0.6 relative to one alkenyl group in the component (A), a cured product cannot be obtained. When it is more than 3, the heat resistance of a cured product deteriorates.

The organohydrogenpolysiloxane of the component (B) can be a mixture of two or more kinds.

[(C) Platinum-Based Catalyst]

The component (C) of the inventive silicone gel composition is used for a catalyst to accelerate an addition reaction of a silicon atom-bonded alkenyl group in the foregoing component (A) and a silicon atom-bonded hydrogen atom in the foregoing component (B). This component (C) is a platinum-based catalyst (platinum or platinum group metal compound selected from platinum-based compounds), and it is possible to use any known one. Illustrative examples thereof include platinum black, chloroplatinic acid, and alcohol-modified chloroplatinic acid and the like; and complexes of chloroplatinic acid and olefin, aldehyde, vinylsiloxane, or acetylenealcohol.

The formulation amount of the component (C) is an effective amount, and can be varied according to a desired curing rate. The amount is generally in a range of 0.1 to 1,000 ppm, preferably 1 to 300 ppm in terms of mass of the platinum atom relative to the total amount of component (A) and component (B). When the formulation amount is too large, the heat resistance of obtained cured product may be deteriorated.

[(D) Carbon Nanotube]

The component (D) of the inventive silicone gel composition is a carbon nanotube, which gives excellent heat resistance to a cured product of the silicone gel composition. Carbon nanotube is known as a material in which a network of six-membered ring made from carbons (graphene sheet) forms a single-layered (single-wall) or multi-layered (multi-wall) coaxial tube, and a structure consist of carbon atoms with a diameter of about several nm to several hundred nm. The carbon nanotube used for the component (D) of the present invention preferably has a length of 0.1 to 30 μm, more preferably 0.1 to 15 μm. These are tend to be dispersed homogeneously when the length is 0.1 μm or more, and tend to be hard to be precipitated when the length is 30 μm or less. Incidentally, the size of the carbon nanotube is not limited if the diameter is 0.5 to 100 nm.

As the carbon nanotube, although the manufacturing process is not particularly limited, the ones synthesized by a plasma CVD (chemical vapor deposition) method, a thermal CVD method, a surface decomposition method, a floating catalyst synthesis method, and an arc discharge method are preferable. As a carbon nanotube, a single-wall nanotube (SWNT), multi-wall nanotube (MWNT), double-wall nanotube (DWNT), and so on are known, and any of these can be used.

In the present invention, any commercial carbon nanotube can be appropriately used.

The formulation amount of the carbon nanotube of the component (0) is 0.01 to 3 parts by mass, preferably 0.02 to 2 parts by mass, more preferably 0.03 to 1 parts by mass relative to 100 parts by mass of the component (A). When the amount is less than 0.01 parts by mass, heat resistance is not obtained; when the amount is more than 3 parts by mass, any further effect is not obtained.

[Other Optional Components]

The inventive composition may contain an optional component in addition to the components (A) to (D) in accordance with a need. Illustrative examples of the optional component include inhibitors, inorganic fillers, organopolysiloxanes which does not contain a silicon atom-bonded hydrogen atom nor a silicon atom-bonded alkenyl group, flame retardants, thixotropy-enhancers, pigments, and dyes.

The inhibitor is a component to suppress a reaction of the composition. Illustrative examples thereof include inhibitors of acetylene type, amine type, carboxylate type, phosphite type.

Illustrative examples of the inorganic filler include inorganic fillers such as fumed silica, crystalline silica, precipitated silica, a hollow filler, silsesquioxane, fumed titanium dioxide, magnesium oxide, zinc oxide, iron oxide, aluminum hydroxide, magnesium carbonate, calcium carbonate, zinc carbonate, layer mica, carbon black, diatomaceous earth, and glass fiber; those fillers which is applied to surface hydrophobitalization treatment with an organosilicon compound such as an organoalkoxysilane compound, an organochlorosilane compound, an organosilazane compound, a low molecular weight siloxane compound. Alternatively, silicone rubber powder, silicone resin powder can be formulated.

The organopolysiloxanes which does not contain a silicon atom-bonded hydrogen atom nor a silicon atom-bonded alkenyl group, the flame retardants, the thixotropy-enhancers, the pigments, and the dyes are not particularly limited, and any known ones can be used.

[Curing of Composition]

The inventive composition can be prepared by mixing the foregoing components (A) to (D) (including an optional component(s) when it is formulated) in accordance with a conventional method. Then, the inventive composition is cured at an ordinary temperature or under a temperature condition in accordance with the use to obtain a silicone gel cured product.

The foregoing inventive silicone gel composition can be a silicone gel cured product with low elastic modulus and low stress, and has excellent heat resistance at 230° C. by containing carbon nanotube, which adds excellent heat resistance to a cured product, when it is cured.

The penetration number defined by JIS K 2220 (¼ cone) of this silicone gel cured product is preferably 10 to 200.

Such a penetration number gives a silicone gel cured product with low elastic modulus and low stress more surely.

It is preferable that the change of the penetration number (measure of a softness) of the silicone gel cured product after heating at 230° C. for 1,000 hours relative to the penetration number of the silicone gel cured product before the heating is −70% or higher. Herein, the change of the penetration number can be calculated as:

change={(the penetration number after the heating−
the penetration number before the heating)/
(the penetration number before the heating)}×
100(%)

As can be seen from this formula, "the change is −70% or higher" in the present invention means that the penetration number after the heating is maintained to 30% or more of the penetration number before the heating, and the change of the penetration number does not go beyond −70% toward the negative side (i.e., an increase of a hardness of the silicone gel after a heating is suppressed).

In such a silicone gel cured product, the penetration number is not lowered too much even when the silicone gel cured product was subjected to a high temperature of 230° C. for a long time after curing. That is, the silicone gel cured product can maintain low elastic modulus and low stress.

As mentioned above, the inventive silicone gel composition can be a silicone gel cured product with low elastic modulus and low stress as well as excellent heat resistance at 230° C., when it is cured. Furthermore, the elastic modulus and stress of the silicone gel cured product can be maintained low even when it is subjected to a high temperature of 230° C. for a long time after curing.

Accordingly, such a silicone gel composition of the present invention can be suitably used for protecting electronic components such as an onboard electronic component and an electronic component for consumer use.

EXAMPLE

Hereinafter, the present invention will be specifically described with reference to examples and comparative examples, but the present invention is not limited thereto. It is to be noted that "Vi" represents a "vinyl group" in the examples. The viscosity indicates a value measured with a rotational viscometer at 25° C.

Example 1

Composition A was prepared by mixing 100 parts by mass of a linear dimethylpolysiloxane in which on the average 0.58 of two monofunctional siloxy units at the both terminals of the molecular chain are blocked with dimethylvinylsiloxy groups and on the average 1.42 of the residue are blocked with trimethylsiloxy groups, having a viscosity of 800 mPa·s; 0.88 parts by mass of a dimethylsiloxane/methylhydrogensiloxane copolymer both terminals of which are blocked with trimethylsiloxy groups (the content of silicon atom-bonded hydrogen atoms=0.57% by mass), having a viscosity of 100 mPa·s (the molar ratio of silicon atom-bonded hydrogen atoms in the component (B) to silicon atom-bonded vinyl group in the component (A): SiH/SiVi=1.13); 0.05 parts by mass of ethynylcyclohexanol; 0.03 parts by mass of carbon nanotube (multi-wall type) with a diameter of 9.5 nm and a length of 1.5 μm; and 0.05 parts by mass of dimethylpolysiloxane solution containing a chloroplatinic acid/1,3-divinyltetramethyldisiloxane complex in a content of 1% by mass of the platinum atom. The obtained Composition A was heated and cured at 120° C. for 30 minutes to obtain Cured product A with a penetration number of 65.

Example 2

Composition B was prepared as in the same manner as Example 1, except that 0.06 parts by mass of the carbon nanotube was used. The obtained Composition B was heated and cured at 120° C. for 30 minutes to obtain Cured product B with a penetration number of 66.

Example 3

Composition C was prepared as in the same manner as Example 1, except that 0.09 parts by mass of the carbon nanotube was used. The obtained Composition C was heated and cured at 120° C. for 30 minutes to obtain Cured product C with a penetration number of 67.

Comparative Example 1

Composition D was prepared as in the same manner as Example 1, except that any carbon nanotube was not used. The obtained Composition D was heated and cured at 120° C. for 30 minutes to obtain Cured product D with a penetration number of 65.

(Evaluation of Heat Resistance)

On each Cured products A to D, which are cured products of Compositions A to D, obtained in the foregoing Examples 1 to 3 and Comparative Example 1, the penetration numbers defined by JIS K 2220 (¼ cone) were evaluated at an initial stage (before a heat resistance test) and after the heat resistance test heating at 230° C. for 1,000 hours. The results are shown in Table 1.

(Evaluation of Cold Resistance)

On each Cured products A to D, which are cured products of Compositions A to D, obtained in the foregoing Examples 1 to 3 and Comparative Example 1, the penetration number defined by JIS K 2220 (¼ cone) was evaluated immediately after it had been left at −40° C. for 24 hours. The results are shown in Table 1.

TABLE 1

|  | Example 1 | Example 2 | Example 3 | Comparative Example 1 |
|---|---|---|---|---|
| Carbon nanotube (parts by mass) | 0.03 | 0.06 | 0.09 | 0 |
| Penetration number (initial) | 65 | 66 | 67 | 65 |
| Penetration number after heat resistance test at 230° C. × 1,000 h | 26 | 43 | 73 | 1 |
| Change of penetration number after heating (%) | −60 | −35 | 9 | −98 |
| Penetration number after cold resistance test | 65 | 66 | 67 | 65 |

As shown in Table 1, in Examples 1 to 3, in which each silicone gel composition contains a carbon nanotube, cured products of a silicone gel composition before the heat resistance test showed low elastic modulus and low stress, and the changes of the penetration number after the heat resistance test were −60% to +9%, which revealed that each silicone gel cured product maintained its softness and kept its elastic modulus and stress low even if they had been left to a high temperature of 230° C. for a long time. Each penetration number was unchanged after the cold resistance test, and each cold resistance was equals to that of Comparative Example 1.

On the other hand, in Comparative Example 1, which does not contain a carbon nanotube, although the cured products showed low elastic modulus and low stress before the heat resistance test, the change of the penetration number after the heat resistance test was −98% to indicate that the silicone gel cured product got hard under the condition at a high temperature of 230° C. for a long time, and the elastic modulus and the stress got higher.

As described above, it has revealed that the inventive silicone gel composition can be a silicone gel cured product with low elastic modulus and low stress as well as excellent heat resistance at 230° C., when it is cured; furthermore, the silicone gel cured product maintains its softness and can keep its elastic modulus and stress low even when it was placed at a high temperature of 230° C. for a long time after curing.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A curable composition to be cured to a silicone gel comprising:
   (A) an organopolysiloxane shown by the following general formula (1), having one or more alkenyl groups bound to a silicon atom in one molecule, wherein the amount is 100 parts by mass, $$R_a R^1_b SiO_{(4-a-b)/2} \qquad (1)$$

wherein "R" independently represents an alkenyl group, "R$^1$" independently represents a substituted or unsubstituted monovalent hydrocarbon group which does not contain an aliphatic unsaturated bond, "a" is a positive number of 0.0001 to 0.2, "b" is a positive number of 1.7 to 2.2, and a+b is 1.9 to 2.4;

(B) an organohydrogenpolysiloxane shown by the following general formula (2), having two or more hydrogen atoms bound to a silicon atom in one molecule, wherein the amount is such that 0.6 to 3 hydrogen atoms bound to a silicon atom is contained relative to one alkenyl group bound to a silicon atom in the component (A), $$R^2_c H_d SiO_{(4-c-d)/2} \qquad (2)$$

wherein "R$^2$" independently represents a substituted or unsubstituted monovalent hydrocarbon group which does not contain an aliphatic unsaturated bond, "c" is a positive number of 0.7 to 2.2, "d" is a positive number of 0.001 to 1, and c+d is 0.8 to 3;

(C) a platinum-based catalyst, wherein the amount is an effective amount; and (D) a carbon nanotube, wherein the amount is 0.01 to 3 parts by mass, wherein the penetration number defined by JIS K 2220 (¼ cone), when the silicone gel composition is cured, is 10 to 200, and the change of the penetration number of the silicone gel cured product after heating at 230° C. for 1,000 hours relative to the penetration number of the silicone gel cured product before the heating is −70% or higher.

* * * * *